United States Patent [19]

Akaogi

[11] Patent Number: 4,998,223

[45] Date of Patent: Mar. 5, 1991

[54] PROGRAMMABLE SEMICONDUCTOR MEMORY APPARATUS

[75] Inventor: Takao Akaogi, Inagi, Japan

[73] Assignee: Fujitsu Limited, Kanagawa, Japan

[21] Appl. No.: 550,786

[22] Filed: Jul. 10, 1990

[30] Foreign Application Priority Data

Jul. 11, 1989 [JP] Japan .................................. 1-178304

[51] Int. Cl.$^5$ ............................................. G11C 8/02
[52] U.S. Cl. ................................ 365/230.03; 365/184; 365/125; 365/200
[58] Field of Search ................... 365/200, 230.03, 184, 365/185

[56] References Cited

U.S. PATENT DOCUMENTS

| | | | |
|---|---|---|---|
| 4,622,653 | 11/1986 | McElroy | 365/230.03 |
| 4,667,313 | 5/1987 | Pinkham et al. | 365/230.03 |
| 4,742,486 | 5/1988 | Takemae et al. | 365/230.03 |
| 4,789,967 | 12/1988 | Liou et al. | 365/230.03 |
| 4,881,200 | 11/1989 | Urai | 365/200 |

*Primary Examiner*—Joseph E. Clawson, Jr.
*Attorney, Agent, or Firm*—Armstrong, Nikaido, Marmelstein, Kubovcik & Murray

[57] ABSTRACT

A programmable semiconductor memory apparatus comprises a memory cell array, a data sense circuit for reading data from the memory cell array, and a bus line connected to a common node of a plurality of bit lines forming the memory cell array and to the data sense circuit, a circuit for storing an identifying code for identifying the programmable semiconductor memory apparatus is connected to the bus line, thereby enabling the identifying code to be read externally.

17 Claims, 6 Drawing Sheets

PROGRAMMABLE SEMICONDUCTOR MEMORY APPARATUS

BACKGROUND OF THE INVENTION

The present invention relates to a programmable semiconductor memory apparatus (called an RWM: Read/Write Memory) and more particularly to an RWM with a circuit for storing a device identifying code.

An RWM can be generally divided into a RAM (Random Access Memory) and a ROM (Read Only Memory). A programmable ROM corresponds to an RWM. A programmable ROM is classified from the viewpoint of structure into a bipolar-type, a FAMOS (Floating-gate Avalanche Injection MOS) or an MNOS (Metal Nitride Oxide Semiconductor), and classified from the viewpoint of whether it is applied into a fuse ROM (programmable ROM), an EP-ROM(Erasable Programmable ROM), an EEP-ROM (Electrically Erasable and Programmable ROM), or an EA-ROM (Electrically Alterable ROM).

An RWM is forwarded from the manufacturer in a blank state, i.e., in a state where the data is not written, the user-side writes data by ROM writer. A ROM writer has a function of automatically setting a condition for writing data into an RWM device. Therefore, a circuit for storing a self device identifying code and enabling the self device identifying code to be read upon writing data into RWM is generally provided on the device side. The self device identifying code represents the conditions for writing data into an RWM such as the name of a manufacturer memory capacity, the kind of writing algorithm and chip revision of the RWM.

Figure 1:
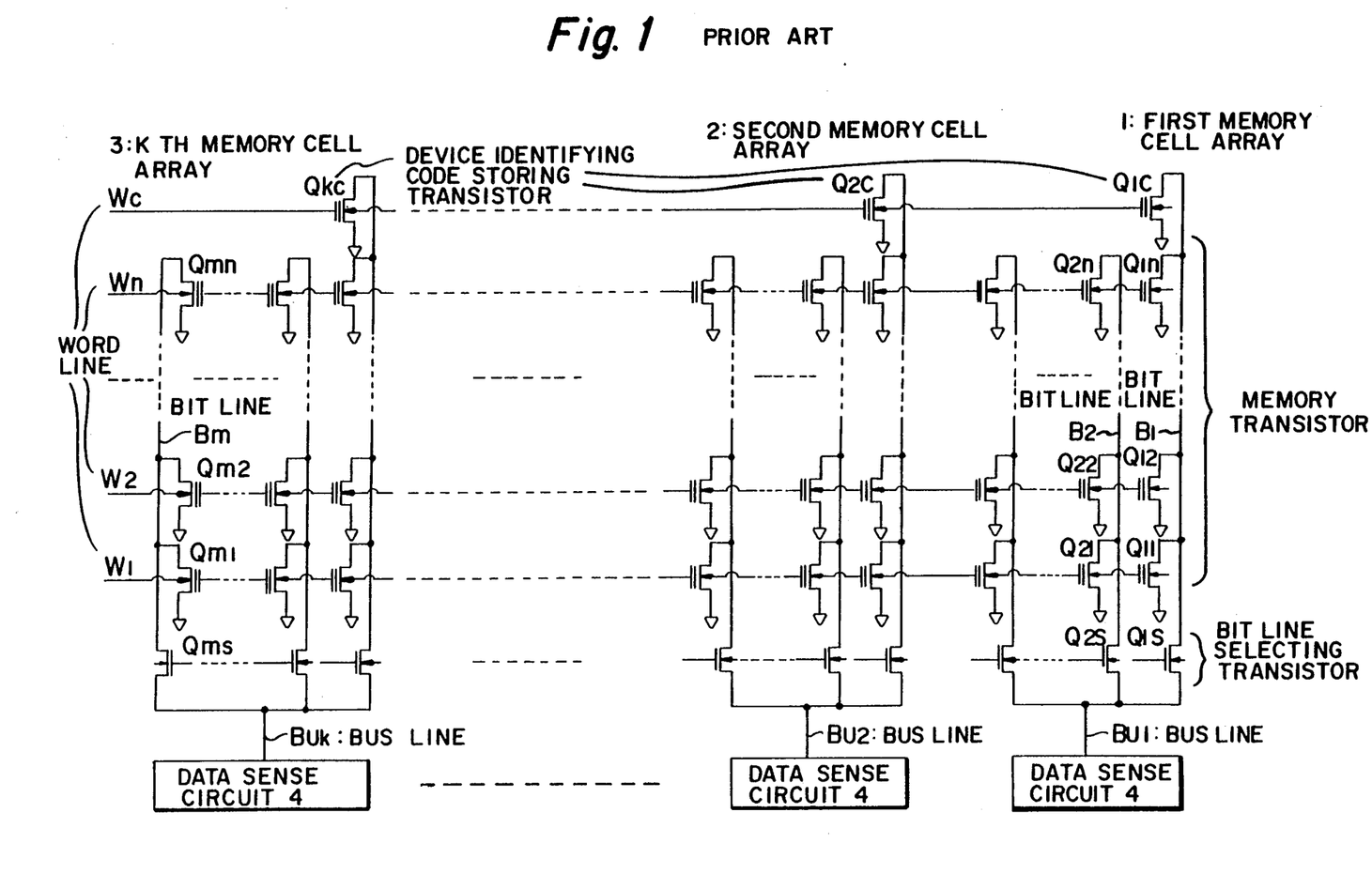
FIG. 1 shows a circuit diagram of an example of a conventional RWM.

FIG. 1 shows the structure of a prior art RWM circuit for explaining the operation of the RWM.

An RWM generally comprises a first memory cell array 1 to a k-th memory cell array 3, and data sense circuits 4. More precisely, a RWM comprises bit lines $B_1$ to $B_m$, word lines $W_1$ to $W_n$ and $W_c$, memory transistors $Q_{11}$ to $Q_{mn}$, bit line selection transistors $Q_{1s}$ to $Q_{ms}$, device identifying code storing transistors $Q_{1c}$ to $Q_{kc}$ and bus lines $B_{u1}$ to $B_{uk}$.

When a memory write is performed in the RWM, an address signal is produced to select one word line (for example $W_1$) and one bit line (for example $B_1$) to select a predetermined memory transistor $Q_{11}$, and data is written by applying an "H" signal or an "L" signal to memory transistor circuit $Q_{11}$. When data is read, a predetermined memory transistor $Q_{11}$ is selected by the same operation as above, thereby outputting the stored data. Generally, the device identifying code is stored in device identifying code storing transistors $Q_{1c}$ to $Q_{kc}$ connected to the bit line. In the prior art shown in FIG. 1, a device identifying code storing transistors $Q_{1c}$ to $Q_{kc}$ is provided for respective memory cell arrays and as k device identifying code storing transistors $Q_{1c}$ to $Q_{kc}$ are used, the number of device identifying codes comprises k bits. In a device of this type, only the exclusive word line $W_c$ may be selected to enable the device identifying code to be read out. This makes a device of this type easy to pattern and thus it is widely used.

In accordance with a recent increase in the degree of LSI integration, a redundant bit line is generally provided to increase yield. A redundant bit line is provided by preparing several spare bit lines in the memory. Thus, even if a faulty bit line, word line or memory cell exists in a memory, a spare bit line is selected when an address signal selecting the faulty portion enters the memory. Thus, a device containing a fault can be used as if it were fault-free. When a redundant bit line is embodied, there is always a possibility of replacing a discretional bit line by a spare bit line. In this case the replaced bit line is not used thereafter. When the device identifying code storing transistor $Q_{ic}$ is connected to the replaced bit line, an element of the device identifying code stored in the device identifying code storing transistor $Q_{ic}$, for example, the i-th element of the k-bit code, is lacking and thus cannot be read out. This prevents the device identifying code from performing an effective function. Therefore, when the bit line redundancy is embodied, the type with the device identifying code stored in the device identifying code storing transistor connected to the bit line cannot be used.

SUMMARY OF THE INVENTION

An object of the present invention is to provide an RWM capable of storing the device identifying code to enable the device identifying code to be easily read out even when bit line redundancy is adopted.

A feature of the present invention resides in a programmable semiconductor memory apparatus comprising memory cell arrays 1,2,3, a data sense circuit for writing data into and reading data from the memory cell array, a bus line connected to a common node of a plurality of bit lines forming the memory cell array, and a means for storing an identifier code for identifying the programmable semiconductor memory device being coupled to the bus line, thereby enabling the identifying code to be read externally.

PREFERRED EMBODIMENTS

An embodiment of the present invention will be explained by referring to the drawings.

Figure 2:
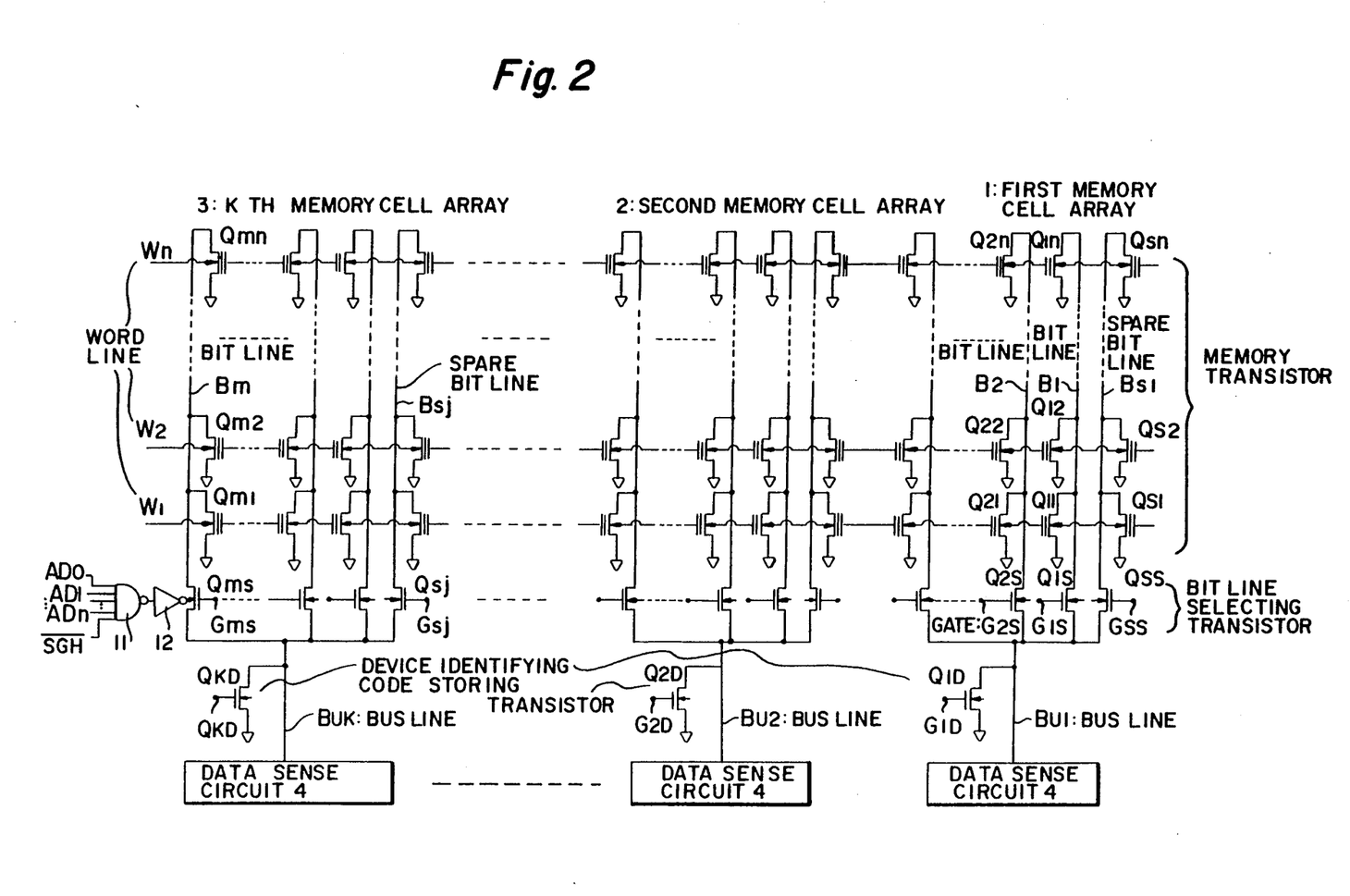
FIG. 2 shows a circuit diagram of a first embodiment of the RWM of the present invention.

FIG. 2 shows the first embodiment of the present invention. In FIG. 2, the same parts as those in the prior art shown in FIG. 1 are provided with the same reference numbers, and detailed explanations of such parts are omitted.

A programmable semiconductor memory apparatus comprises memory cell arrays 1,2,3, data sense circuits 4 for writing data into and reading data from said memory cell arrays 1,2,3, bus lines $B_{u1}$ to $B_{uk}$ connected to a common node of a plurality of bit lines $B_1$ to $B_m$, $B_{s1}$ to $B_{sj}$ forming the memory cell arrays 1,2,2, and a means for storing an identifying code for identifying said programmable semiconductor memory device being coupled to said bus lines $B_{u1}$ to $B_{uk}$, thereby enabling said identifying code to be read externally.

In the present invention with the above structure, even when a bit line redundancy is embodied in an RWM, a discretional spare bit line is selected in place of a faulty bit line. The device identifying code is not stored in device identifying code storing transistors $Q_{1c}$ to $Q_{kc}$ connected to the bit line as in the case of the prior art RWM, but in a memory circuit connected to bus lines $B_{u1}$ to $B_{uk}$ provided between the common node of the bit lines $B_1$ to $B_m$ and $B_{s1}$ to $B_{sj}$ and the data sense circuits 4. Therefore, even if one of the faulty bit lines is disposed of, and instead any spare bit line is selected, a device identifying code can be correctly read out without being affected.

In FIG. 2, the portions which are different from those in FIG. 1 are as follows. Spare bit lines $B_{s1}$ to $B_{sj}$ are provided, the device identifying code storing transistors $Q_{1c}$ to $Q_{kc}$ connected to the bit lines $B_1$ to $B_m$ are deleted and instead the device identifying code storing transistors $Q_{1D}$ to $Q_{kD}$ connected to bus lines $B_{u1}$ to $B_{uk}$ are newly provided. The number of spare bit lines is not limited to 1 per respective memory cell array. $G_{ss}$ to $G_{sj}$ represent gate terminals of spare bit line selecting transistors $Q_{ss}$ to $Q_{sj}$. When the address signal for selecting a faulty bit line, for example $B_2$, enters gate $G_{2s}$, an "H" signal for selecting a spare bit line, for example $B_{s1}$, is applied to gate $G_{ss}$ and bit line $B_2$ is replaced by spare bit line $B_{s1}$.

A device identifying code is programmed in device identifying code storing transistors $Q_{1D}$ to $Q_{kD}$ upon the manufacturing of an RWM.

Device identifying code storing transistors $Q_{1D}$ to $Q_{kD}$ are turned on when an (H) signal more than threshold voltage $V_{TH}$ is applied to the gates $G_{1D}$ to $D_{kD}$ thereof and they are turned off when an (L) signal less than the threshold voltage $V_{TH}$ is applied to $G_{1D}$ to $G_{kD}$ thereof. Thus, the device identifying storing transistors $Q_{1D}$ to $Q_{kD}$ are of the enhancement type. Device identifying code storing transistors $Q_{1D}$ to $Q_{kD}$ are of the type having a threshold voltage $V_{TH}$ changed by an electric operation. For example, the transistors $Q_{1D}$ to $Q_{kD}$ are formed such that in accordance with an electrical operation, they have two threshold voltages comprising a voltage $V_1$ which is higher than the source voltage Vcc and a voltage $V_2$ which is lower than the source voltage Vcc. Codes determined as being logic "0" or "1" depending on voltages $V_1$ and $V_2$ are provided for respective device identifying code storing transistors $Q_{1D}$ to $Q_{kD}$. When the power source voltage Vcc is applied to gates $G_{1D}$ to $G_{kD}$, the transistor with the threshold voltage of $V_1$ is turned off and the transistor with the threshold voltage $V_2$ is turned on. Namely, k bits of device identifying code can be stored by determining that logic "0" corresponds to voltage $V_1$ and logic "1" corresponds to voltage $V_2$, depending on whether the threshold voltage of the transistors $Q_{1D}$ to $Q_{kD}$ is determined as being $V_1$ or $V_2$. Conversely, k bits of device identifying code may be stored by determining that logic "1" corresponds to voltage $V_1$ and logic "0" corresponds to voltage $V_2$. In other words, the device identifying code can be programmed based on threshold voltages $V_1$ and $V_2$ of device identifying storing transistors $Q_{1D}$ to $Q_{kD}$.

Address signals $A_{Do}$ to $A_{Dn}$ and signature signal $\overline{SGH}$ are applied to NAND circuit 11. The output of NAND circuit 11 is applied to gates $G_{1s}$ to $G_{ms}$ of bit line selecting transistors $Q_{1s}$ to $Q_{ms}$ and gates $G_{ss}$ to $G_{sj}$ of spare bit line selecting transistors $Q_{ss}$ to $Q_{sj}$ through inverter 12.

Next, the operation of the present invention will be explained.

When a memory write and memory read is performed, the same operation as in the ordinary RWM is conducted and one memory transistor, for example, $Q_{11}$, is selected and the data to be stored is input to the RWM.

When the device identifying code is read out, an "L" signal is applied to all the gates of $G_{1s}$ to $G_{ms}$ of bit line selecting transistors $Q_{1s}$ to $Q_{ms}$ and gates $G_{ss}$ to $G_{sj}$ of spare bit line selecting transistors $Q_{ss}$ to $Q_{sj}$ from inverter 12, as signature signal SGH is turned high. Thus all the bit lines are electrically disconnected from the bus lines $B_{u1}$ to $B_{uk}$. Next, source voltage Vcc is applied to gates $G_{1D}$ to $G_{kD}$ of device identifying code storing transistors $Q_{1D}$ to $Q_{kD}$ and thus the device identifying code can be read out. Alternatively, NMOS transistors may be provided between the common nodes of bit lines and a spare bit line forming memory cell arrays 1, 2 and 3 and drains of NMOS transistors $Q_{1D}$ to $Q_{kD}$. The signature signal $\overline{SGH}$ may be applied to gates of the NMOS transistors to read the device identifying code.

THE SECOND EMBODIMENT

Figure 3:
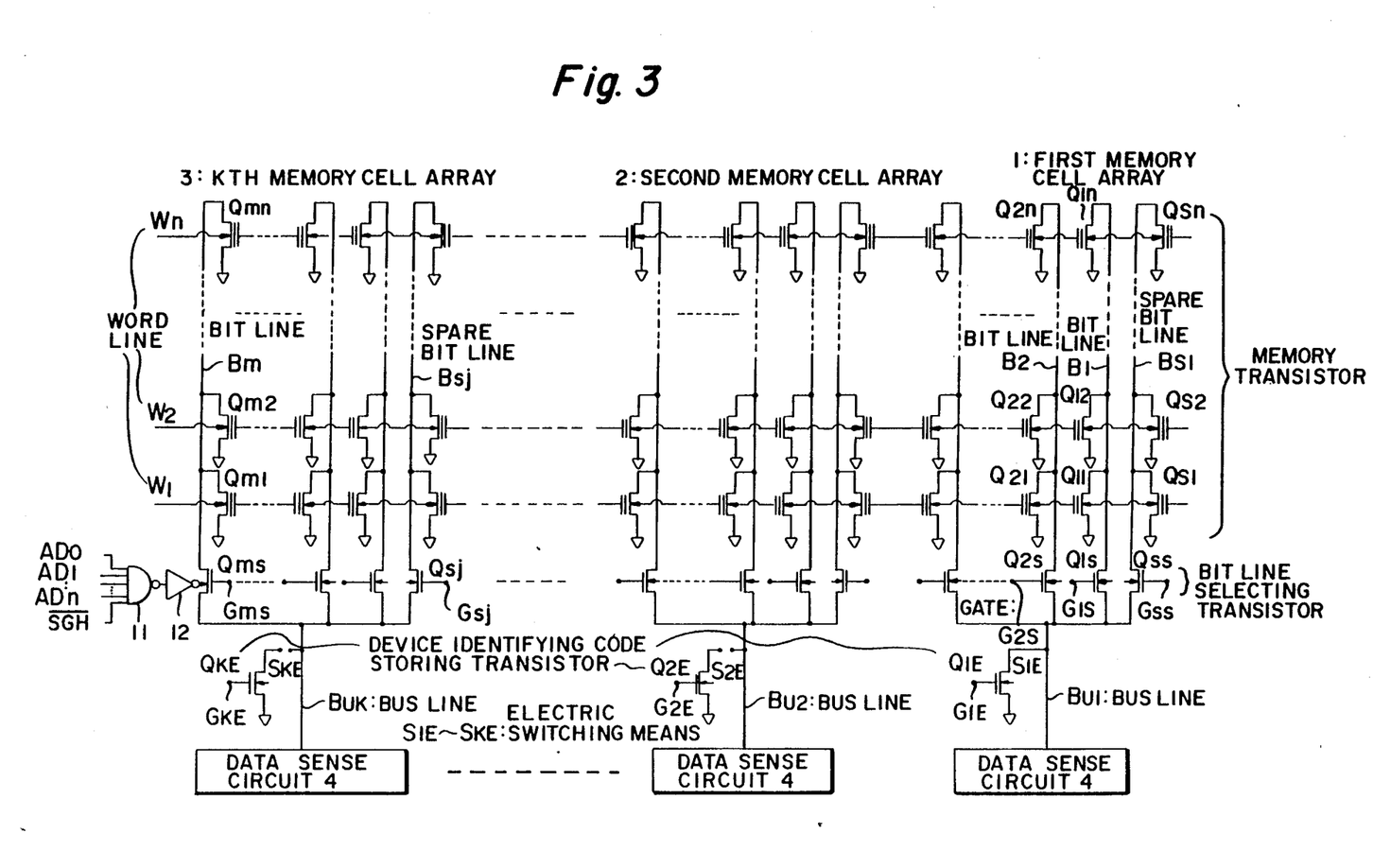
FIG. 3 shows a circuit diagram of a second embodiment of the RWM of the present invention.

FIG. 3 shows the second embodiment of the present invention. This embodiment is different from that in FIG. 2 in that device identifying storing transistors $Q_{1E}$ to $Q_{kE}$ are provided in place of device identifying code storing transistors $Q_{1D}$ to $Q_{kD}$ shown in FIG. 2, and electric switching means $S_{1E}$ to $S_{kE}$ are provided on a line connecting device identifying code storing transistors $Q_{1E}$ to $Q_{kE}$ and bus lines $B_{u1}$ to $B_{uk}$.

Device identifying code storing transistor $Q_{1E}$ to $Q_{kE}$ are different from device identifying code storing transistors $Q_{1D}$ to $Q_{kD}$ in that the threshold voltage $V_{TH}$ may not be variable in accordance with an electric operation. Transistors $Q_{1D}$ to $Q_{kD}$ turn on when an (H) signal is applied to gates $G_{1E}$ to $G_{kE}$. In the second embodiment the threshold voltage $V_{TH}$ is made less than or equal to power source voltage Vcc.

In the second embodiment, the device identifying code is programmed by using electric switching means $S_{1E}$ to $S_{kE}$. Electric switching means $S_{1E}$ to $S_{kE}$ may be of the so-called fuse type which are conductive before programming but are melted to be cut out or made nonconductive by an application of a current upon programming. Electric switching means $S_{1E}$ to $S_{kE}$ may also be of the type which are nonconductive before programming but, are made conductive by an application of a current upon programming when connected through melting. It is possible to program the device identifying code by determining logic "1" for ON and determining logic "0" for OFF, depending on whether the electric switching means is conductive (ON) or nonconductive (OFF). Conversely, the program of the device identifying code may be performed so that logic "1" is determined for OFF and logic "0" for ON for electric switching means $S_{1E}$ to $S_{kE}$. In this case, the device identifying code comprises k-bit code, as the number of the electric switching means is k.

Next, the operation will be explained. In case of a memory write or read, the same operation as in the first embodiment may be performed.

When the device identifying code is read, an (L) signal is applied to all the gates of bit line selection transistors $Q_{1S}$ to $Q_{ms}$ and gates $G_{ss}$ to $G_{sj}$ of spare bit line selection transistors $Q_{ss}$ to $Q_{sj}$ and all the bit lines are cut off from bus lines $B_{u1}$ to $B_{uk}$. Next, when the source voltage Vcc is applied to gate $G_{1E}$ to $G_{kE}$ of device identifying code storing transistors $Q_{1E}$ to $Q_{kE}$, the device identifying code is programmed depending on the on-and-off electric switching means $S_{1E}$ to $S_{kE}$.

Figure 4:
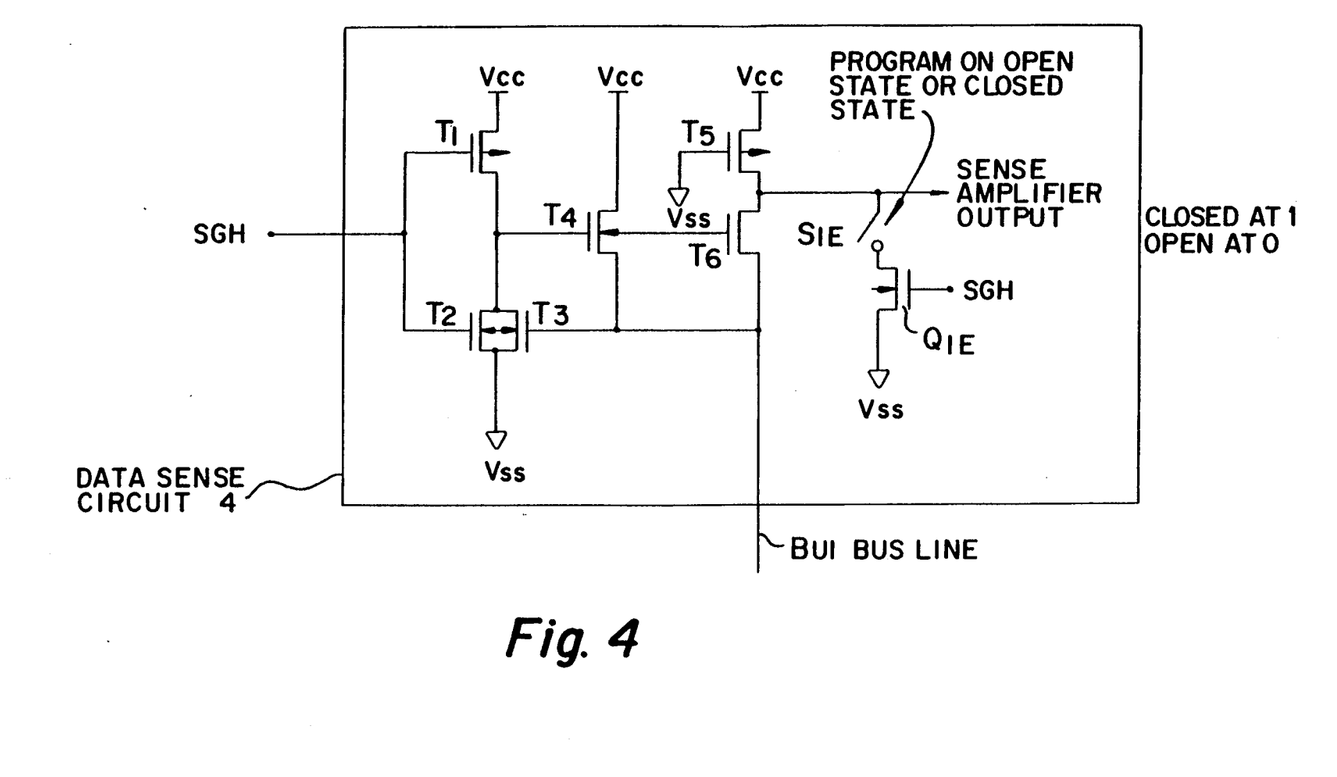
FIG. 4 shows another embodiment of the present invention.

FIG. 4 shows an embodiment in which device identifying code transistor $Q_{1E}$ is provided with a data sense circuit 4. A sense amplifier comprises transistor $T_1$, $T_2$, $T_3$, $T_4$ and $T_6$. When the data is not stored in a cell connected to the bus line $B_{u1}$, the voltage of the bus line $B_{u1}$ is made low and NMOS transistor $T_3$ is turned off, thus the NMOS transistors $T_4$ and $T_6$ are turned on, thus the current is deprived from a line sense amplifier OUTPUT through NMOS transistor $T_6$, and thus the voltage of the line sense amplifier OUTPUT is made low. As a result, low data is read from the cell. When a signature signal SGH is high, PMOS transistor $T_1$ is turned off and thus the sense amplifier does not operate. When the signature signal SGH applied to the device identifying code NMOS transistor $Q_{1E}$ is high, the device identifying code is read out from the line sense amplifier OUTPUT of the sense amplifier, depending on whether the switch $S_{1E}$ provided between the device identifying transistor $Q_{1E}$ and the line sense amplifier OUTPUT is on or off. That is, when the switch $S_{1E}$ is opened, the logic "0" is output from sense amplifier OUTPUT and when the switch $S_{1E}$ is closed, the logic "1" is output. In this embodiment, when the device identifying code is read out, it is necessary both to apply an "L" signal to all the gates of the bit line selection transistors and spare bit line selection transistors and to apply a high signature signal SGH "H" to the gate of the device identifying NMOS transistor $Q_{1E}$.

Figure 5:
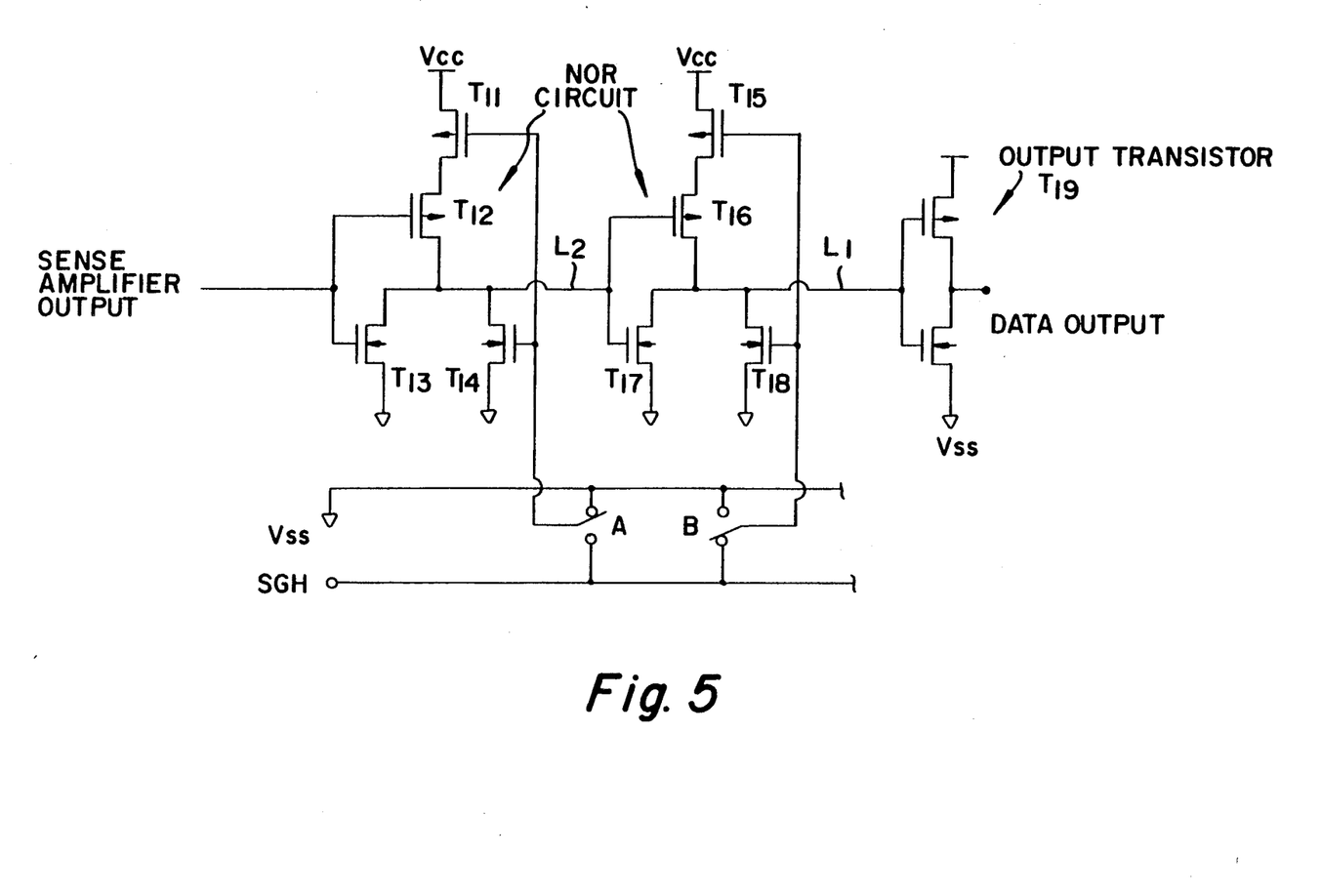
FIG. 5 shows a further embodiment of the present invention.

FIG. 5 shows an embodiment in which a device identifying code circuit element is provided in an output buffer. When the signature SGH becomes "H" the device identifying code is read out. When switch A is connected to $V_{ss}$ and switch B is connected to the signal SGH, then output transistor $T_{19}$ produces "H" through a NOR circuit comprising transistors $T_{11}$, $T_{12}$, $T_{13}$ and $T_{14}$ and a NOR circuit comprising transistors $T_{15}$, $T_{16}$, $T_{17}$ and $T_{18}$. That is, when switch B is connected to signature SGH and is high, NMOS transistor $T_{18}$ is turned on and line $L_1$ becomes low, enabling the output of output transistor $T_{19}$ to be "H". Next, in order to make the data output "L", the switch A is connected to signature SGH and the switch B is connected to Vss. Therefore, NMOS transistor $T_{14}$ becomes conductive and line $L_2$ becomes low, thereby enabling NMOS transistor $T_{17}$ to be nonconductive and PMOS transistor $T_{16}$ to be conductive. Therefore, line $L_1$ becomes high and thus the output of output transistor $T_{19}$ becomes "L". When the signature SGH is low, switch A is connected to Vss and switch B to SGH, both NMOS transistors $T_{14}$ and $T_{18}$ become nonconductive and thus, the signature SGH for obtaining the device identifying code is cut off from a signal transmission line from sense amplifier OUTPUT, line $L_2$, line $L_1$, and DATA OUTPUT. In this case, PMOS transistor $T_{11}$ is turned on and when sense amplifier OUTPUT is "H", PMOS transistor $T_{12}$ is nonconductive and line $L_2$ is "L". Then, PMOS transistors $T_{15}$ and $T_{16}$ become conductive, thereby allowing line $L_1$ to be "H" and DATA OUTPUT of transistor $T_{19}$ to be "L". Thus, when the signature SGH is "L", the output of the sense amplifier is provided at the DATA OUTPUT after the output of the sense amplifier is inverted. In this embodiment the output of the data sense circuit is applied to the sense amplifier output line sense amplifier OUTPUT and the device identifying code is read out from the data output through the output transistor $T_{19}$.

Figure 6:
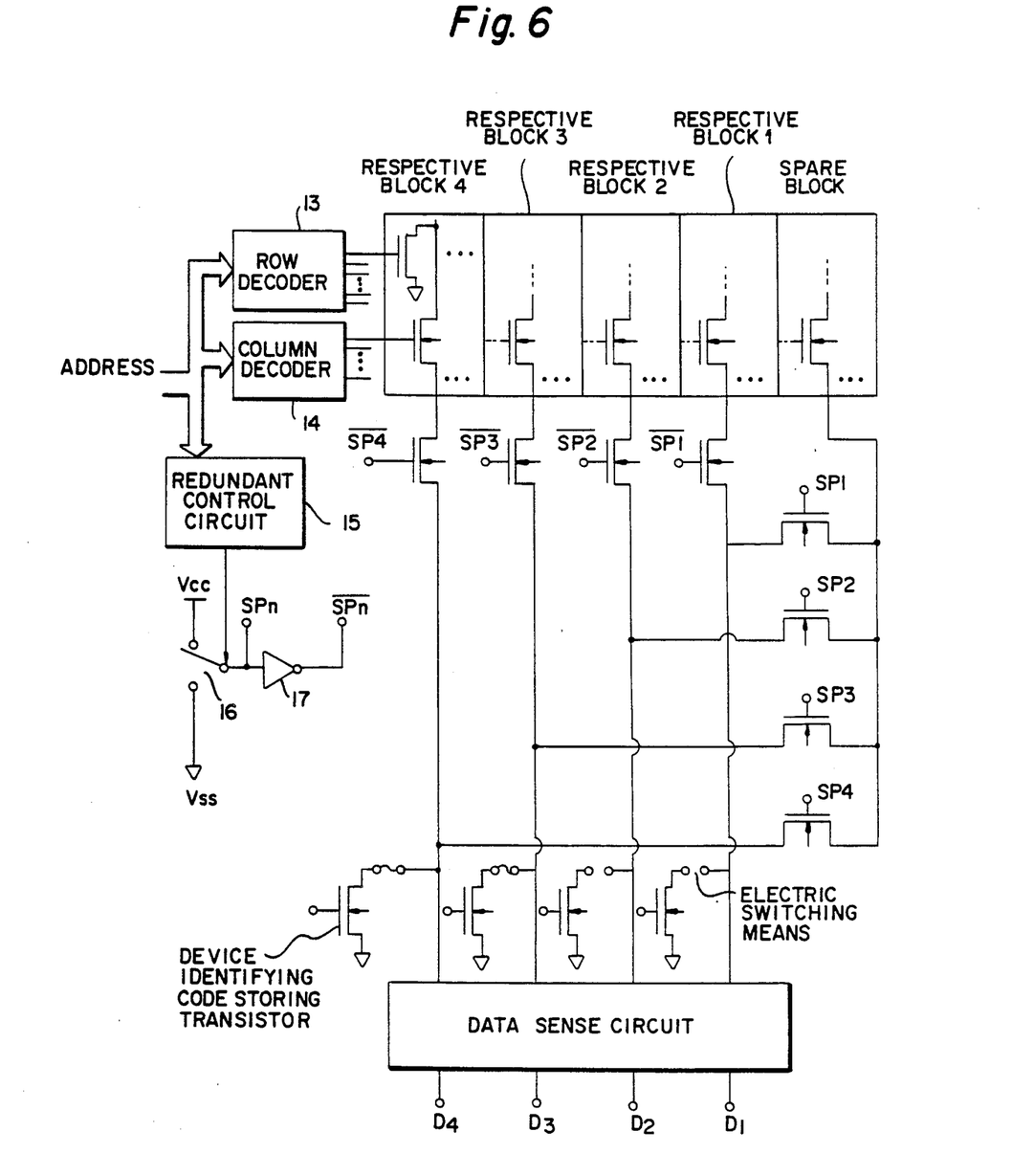
FIG. 6 shows a still further embodiment of the present invention.

As shown in FIG. 6, instead of replacing a faulty bit line by a spare bit line, a block comprising a plurality of bit lines can be replaced by a spare block. Respective blocks 1 to 4 correspond to the output of the device for producing 4 bit output. If a block 1 is faulty, then signal SP1 turns "H" and $\overline{SP1}$ turns "L" and then the block 1 corresponding to one output bit of 4 bit output is replaced by a spare block. More specifically, an address signal is applied to blocks 1 to 4 and spare block through row decoder 13 and column decoder 14 and is also applied to a redundant control circuit 15, in which an address corresponding to a faulty cell is stored, for example. Thus, when the address signal corresponding to the faulty cell is applied to redundant control circuit 15, switch 16 is turned to Vcc. Thus, $SP_n$ becomes high and $\overline{SP}_n$ becomes low through inverter 17, thereby selecting the spare block. Device identifying code storing transistors are respectively connected to blocks 1 to 4 and spare block through electric switching means and bus lines in the same manner as shown in FIG. 2 and 3. Data $D_1$ to $D_4$ are read out from the data sense circuit. Therefore, the present invention can be applied to the embodiment shown in FIG. 6 in which the faulty bit line block among the respective blocks 1 to 4 can be replaced by a spare block. The present invention is also applicable to the case where each of respective blocks 1 to 4 comprise one bit line.

The embodiments of the RWM as shown in FIGS. 2 to 6 are designated as being the present invention. However, the RWM circuit structure is not limited to these embodiments as the RWM having other circuit structures is within the scope of the present invention. For example, as the RWM of the present invention is useful where bit line redundancy does not exist, an RWM which does not have a spare bit line is within the scope of the present invention. The device identifying code storing circuit connected to the bus line may be formed of other means for storing the code. The circuit structure of the present invention is not limited to the embodiments shown in FIGS. 2 and 3. The other circuit structure may be within the scope of the present invention. In the above embodiments, one cell for storing logic "1" or "0" comprises one transistor, for example $Q_{1n}$, but it may comprise a plurality of transistors.

As described above, according to the present invention, even if bit line redundancy exists in the RWM, the device identifying code can be stored in the RWM by programming a program using the device identifying code storing circuit connected to the bus line. Thus, even if the fault bit line is disposed and the spare bit line is selected, the device identifying code can be read out without it being affected by a selection of the spare bit line.

What is claimed is:

1. A programmable semiconductor memory apparatus comprising:
   a memory cell array;
   a plurality of bit lines connected to said memory cell array;
   a bus line connected to one of said bit lines in response to an address signal;
   a data sense circuit connected to said bus line for reading data from said memory cell array, and
   a means for storing an identifying code for identifying said programmable semiconductor memory apparatus, said storing means being coupled to said bus line, thereby enabling said identifying code to be read externally.

2. The semiconductor memory device according to claim 1, wherein said means for storing the identifying code is connected to said bus line between said bus line and said data sense circuit.

3. The semiconductor memory apparatus according to claim 1, wherein a spare bit line is connected to said bus line so that one of said plurality of bit lines which is faulty is replaced by a bit line.

4. The programmable semiconductor memory apparatus according to claim 1, wherein all word lines of said memory cell array are made non-active when the identifying code is read out.

5. The programmable semiconductor memory apparatus according to claim 1, wherein said means for storing the identifying code comprises a first and second transistor each connected to said bus line, the first transistor having a first threshold voltage and the second transistor having a second threshold voltage, and when a gate voltage is applied to said first and second transistors, the first transistor becomes conductive and the second transistor becomes nonconductive, thereby providing logic "1" and "0", respectively.

6. The programmable semiconductor memory apparatus according to claim 1, wherein said means for storing the identifying code comprises a transistor for determining logic "1" and logic "0" depending on whether or not the drain of the transistor is connected to the bus line through a fuse provided between the drain and the bus line.

7. The programmable semiconductor memory apparatus according to claim 1, wherein said means for storing the identifying code is provided within said data sense circuit.

8. The programmable semiconductor memory apparatus according to claim 1, wherein said means for storing the identifying code is provided within the output buffer circuit.

9. A programmable semiconductor memory apparatus comprising:
a memory cell array;
a plurality of bit lines connected to said memory cell array;
a bus line connected to one of said bit lines in response to an address signal;
a data sense circuit connected to said bus line for reading data from said memory cell array, and
a means for storing an identifying code for identifying said programmable semiconductor memory apparatus, said storing means being coupled to said bus line, thereby enabling said identifying code to be read externally, and
a switch means, connected to said data sense circuit, for receiving a signature signal designating that the identifying code has been read out from said memory cell array and for producing the identifying code regardless of the output of the data sense circuit.

10. The programmable semiconductor memory apparatus according to claim 9, wherein said switching means controls a gate of a pull-up transistor to determine whether a data from said data sense circuit is output or the said identifying code is output.

11. A programmable semiconductor memory device comprising:
a spare memory cell array block;
a data sense circuit for reading data from said memory cell array block,
a bus line connected to the output of both said memory cell array block and said spare memory cell array block;
a means for storing an identifying code for identifying said programmable semiconductor memory device, said storing means being coupled to said bus line, thereby enabling said identifying code to be read externally and
a switching means provided between said memory cell array block and said bus line and between said spare memory cell array block and the bus line wherein, when said memory cell array block is faulty, the spare memory cell array block is connected to said bus line.

12. The programmable semiconductor memory device according to claim 11, wherein said memory cell array block comprises a single bit line.

13. The semiconductor memory device according to claim 11, wherein said means for storing the identifying code is provided between said bus line and said data sense circuit.

14. The semiconductor memory device according to claim 11, wherein a spare bit line is connected to said bus line so that one of said plurality of bit lines which is faulty is replaced by said spare bit line.

15. The programmable semiconductor memory device according to claim 11, wherein all word lines of said memory cell array block are made non-active when the identifying code is read out.

16. The programmable semiconductor memory device according to claim 11, wherein said means for storing the identifying code comprises first and second transistors each connected to said bus line, the first transistor having a first threshold voltage and the second transistor having a second threshold voltage, and when a gate voltage is applied to said first and second transistors, the first transistor becomes conductive and the second transistor becomes non-conductive, thereby providing logic "1" and "0", respectively.

17. The programmable semiconductor memory device according to claim 11, wherein said means for storing the identifying code comprises a transistor for determining logic "1" and logic "0" depending on whether or not the drain of the transistor is connected to the bus line through a fuse provided between the drain and the bus line.

* * * * *